United States Patent

Hoshita

[11] Patent Number: 6,084,821
[45] Date of Patent: Jul. 4, 2000

[54] SEMICONDUCTOR STORAGE DEVICE HAVING A DIVIDED WORD LINE STRUCTURE

[75] Inventor: Tetsushi Hoshita, Hyogo, Japan

[73] Assignee: Mitsubishi Denki Kabushiki Kaisha, Tokyo, Japan

[21] Appl. No.: 09/225,468

[22] Filed: Jan. 6, 1999

[30] Foreign Application Priority Data

Jul. 21, 1998 [JP] Japan .................................. 10-204870

[51] Int. Cl.[7] ....................................................... G11C 8/00
[52] U.S. Cl. .................. 365/230.06; 365/230.03
[58] Field of Search ........................... 365/189.11, 230.03, 365/230.06

[56] References Cited

U.S. PATENT DOCUMENTS 5,946,243   8/1999   Sim ..................................... 365/189.11

Primary Examiner—David Nelms
Assistant Examiner—M. Tran
Attorney, Agent, or Firm—McDermott, Will & Emery

[57] ABSTRACT

There is described a divided word line semiconductor storage device including a plurality of sub-word lines each having an open end and a main word line provided so as to be shared among the plurality of sub-word lines. The semiconductor storage device further includes a decoder which selectively supplies a high or low potential to a predetermined portion of each sub-word line according to whether or not the sub-word line corresponds to a designated address, and switching devices capable of connecting the open ends of the plurality of sub-word lines to a ground potential.

7 Claims, 7 Drawing Sheets

SEMICONDUCTOR STORAGE DEVICE HAVING A DIVIDED WORD LINE STRUCTURE

BACKGROUND OF THE INVENTION

1. Field of the Invention

The present invention generally relates to a semiconductor storage device having a divided word line structure and, more particularly, to a semiconductor storage device having a divided word line structure suitable for preventing the influence of noise generated among a plurality of adjacent sub-word lines.

2. Description of the Background Art

A divided word line (DWL) structure has been known as one type of structures of semiconductor storage devices. A semiconductor storage device of this type will be hereinafter referred to as a "DWL storage device."

FIG. 7 is a circuit diagram showing the principal elements of a former DWL storage device. A memory bank region 10 shown in FIG. 7 is a part of one of the plurality of memory banks possessed by the former DWL storage device. A plurality of memory cells (not shown) are two-dimensionally arranged in the memory bank region 10.

The former DWL storage device has a plurality of main word lines (MWL) including MWL<0> and MWL<1> shown in FIG. 7. MWL<0> and MWL<1> are provided so as to extend and pass through the memory bank region 10, being made of an aluminum wiring layer laid on the memory cells.

The former DWL storage device has a plurality of sub-word lines (SWL) including SWL<0> to SWL<7> shown in FIG. 7. SWL<0> to SWL<7> are transfer gates formed below MWL<0> and MWL<1>, being made from polysilicon. SWL<0> to SWL<3> pertain to one SWL group and are provided so as to correspond to MWL<0>. On the other hand, SWL<4> to SWL<7> pertain to another SWL group and are provided so as to correspond to MWL<1>. The group of SWL<0> to SWL<3> and the group of SWL<4> to SWL<7> are referred to as "the same group SWLs" hereunder.

Individual memory cells provided in the memory bank region 10 can be specified by designation of row and column addresses. In the former DWL storage device, MWL<0>, MWL<1>, and SWL<0> to SWL<7> are used for specifying the row address of the memory cell.

Further, the former DWL semiconductor storage device has a plurality of sub-decoder bands so that either side of each of the memory banks are provided with a sub-decoder band. Sub-decoder bands 12 and 14 shown in FIG. 7 are the ones which are placed on respective sides of the memory bank region 10.

In the sub-decoder band 12, there are provided a pair of sub-decode line SDL<0> and reverse sub-decode line /SDL<0>, and a pair of sub-decode line SDL<2> and reverse sub-decode line /SDL<2>. SDL<0> and SDL<2> are furnished with sub-decode signals SD<0> and SD<2> transmitted from an unillustrated sub-row decoder. Further, /SDL<0> and /SDL<2> are furnished with reverse signals /SD<0> and /SD<2> transmitted from an unillustrated sub-row decoder.

In the sub-decoder band 14, there are provided a pair of sub-decode line SDL<1> and reverse sub-decode line /SDL<1>, and a pair of sub-decode line SDL<3> and reverse sub-decode line /SDL<3>. SDL<1> and SDL<3> are furnished with sub-decode signals SD<1> and SD<3> transmitted from an unillustrated sub-row decoder. Further, /SDL<1> and /SDL<3> are furnished with reverse signals /SD<1> and /SD<3> transmitted from an unillustrated sub-row decoder.

SWL<0>, SWL<2>, SWL<4>, and SWL<6> are provided so as to pass through the sub-decoder band 12 and become open-ended in the vicinity of the sub-decoder band 14. These sub-word lines will be hereinafter referred to as "even-numbered sub-word lines." In contrast, SWL<1>, SWL<3>, SWL<5>, and SWL<7> are provided so as to pass through the sub-decoder band 14 and become open-ended in the vicinity of the sub-decoder band 12. These sub-word lines will be hereinafter referred to as "odd-numbered sub-word lines."

SWL<0> is connected to an even-numbered common ground line 18 by way of an N-type MOS transistor 16, as well as to the even-numbered common ground line 18 and SDL<0> by way of a transistor pair 20. The gate of the N-type MOS transistor 16 is connected to /SDL<0>. The transistor pair 20 comprises an N-type MOS transistor 22 and a P-type MOS transistor 24. MWL<0> is connected to the gate of the N-type MOS transistor 22 and to the gate of the P-type MOS transistor 24.

As in the case of SWL<0>, the even-numbered sub-word line SWL<2> is connected to the even-numbered common ground line 18 and MWL<0> by way of the N-type MOS transistor 16 and the transistor pair 20, and the even-numbered sub-word lines SWL<4> and SWL<6> are connected to the even-numbered common ground line 18 and MWL<1> by way of the N-type MOS transistor 16 and the transistor pair 20. On the other hand, the odd-numbered sub-word lines SWL<1> and SWL<3> are connected to the odd-numbered common ground line 26 and MWL<0> by way of the N-type MOS transistor 16 and the transistor pair 20, and the odd-numbered sub-word lines SWL<5> and SWL<7> are connected to the odd-numbered common ground 26 and MWL<1> by way of the N-type MOS transistor 16 and the transistor pair 20.

In the former DWL storage device, an unillustrated main-row decoder is connected to MWL<0> and MWL<1>. When a designated main row address corresponds to any of SWL<0> to SWL<3>, the main row decoder supplies a boost potential Vpp to MWL<0>. In contrast, when the designated row address does not correspond to any one of SWL<0> to SWL<3>, the main row decoder maintains MWL<0> at a ground potential GND. Similarly, when the designated row address corresponds to any of SWL<4> to SWL<7>, the main row decoder supplies the boost potential Vpp to MWL<1>. In contrast, when the designated row address does not correspond to any one of SWL<4> to SWL<7>, the main row decoder maintains MWL<1> at the ground potential Vss.

In the former DWL storage device, when the designated row address corresponds to the sub-word line which is belongs to the even-numbered sub-word line and is assigned the lowest reference numeral among the same group SWLs; more specifically, the designated row address corresponding to SWL<0> or SWL<4>, the foregoing sub-row decoder brings SD<0> to the boost potential Vpp and brings /SD<0> into the ground potential Vss. At this time, the remaining sub-decode signals SD<1> to SD<3> are maintained at the ground potential Vss, and the remaining reverse sub-decode signals /SD<1> to /SD<3> are maintained at the boost voltage Vpp.

When the designated row address corresponds to SWL<2> or SWL<6>, the sub-row decoder brings SD<2> to the boost potential Vpp and brings /SD<2> to the ground potential Vss. Likewise, when the designated row address corresponds to SWL<1> or SWL<5> the sub-row decoder brings the sub-decode signal corresponding to the designated sub-word line (i.e., SD<1>) to the boost voltage Vpp and brings the reverse signal corresponding to the designated sub-word line (i.e., /SD<1>) to the ground potential Vss. Similarly, when the designated row address corresponds to SWL<3> or SWL<7>, the sub-row decoder brings the sub-decode signal corresponding to the designated sub-word line (i.e., SD<3>) to the boost voltage Vpp and brings the reverse signal corresponding to the designated sub-word line (i.e., /SD<3>) to the ground potential Vss.

In the former DWL storage device, when the row address corresponding to SWL<0> is designated, MWL<0> is brought to the ground potential Vss. As a result, the P-type MOS transistor of the transistor pair 20 is turned on, and SWL<0> and SDL<0> are brought into conduction. Further, SD<0> is brought into the boost potential Vpp, and /SD<0> is brought into the ground potential Vss under the foregoing designation. In this case, the boost potential Vpp is transmitted to SWL<0> from SDL<0> while the N-type MOS transistor 16 is turned off. As a result, SWL<0> is brought into a high potential.

When the row address corresponding to SWL<0> is designated, SWL<1> and SWL<3> are each connected to the common ground line 26 by way of the N-type MOS transistors 16, and SWL<2> is connected to the common ground line 18 by way of the N-type MOS transistor 16. Further, SWL<1> to SWL<3> are connected to SDL<1>, SDL<2>, or SDL<3>, respectively by way of the transistor pairs 20. At this time, SDL<1> to SDL<3> are receiving the ground potential Vss. Accordingly, SWL<1> to SWL<3> are maintained at the ground potential Vss.

When the row address corresponding to SWL<0> is designated as mentioned above, SWL<4> is connected to the common ground line 18 by way of the transistor pair 20. Further, in this case, SWL<5> and SWL<7> are each connected to the common ground line 26 by way of the N-type MOS transistor 16 and the transistor pair 20, and SWL<6> is connected to the common ground line 18 by way of the N-type MOS transistor 16 and the transistor pair 20. Accordingly, SWL<5> to SWL<7> are maintained at the ground potential Vss. As mentioned above, the former DWL storage device enables selective activation of only the sub-word line corresponding to the designated address.

In the storage device, the word line which permits transmission of a signal corresponding to a row address is formed primarily for the purpose of reduction of resistance by combination of a metal wiring pattern and a transfer gate (i.e., a polysilicon wiring pattern). To realize such a configuration of the word line, the metal wiring pattern must be formed above the memory cells, i.e., above an irregular surface including convex portions and concave portions which stem from the memory cells, as in the case of the foregoing main word line. For this reason, ensuring dimensional accuracy of the metal wiring pattern is more difficult than ensuring that of the transfer gate.

In the former DWL storage device, the word line is formed by combination of a main word line (a metal wiring pattern) and sub-word lines (transfer gates), and the main word line is provided so as to be shared among a plurality of sub-word lines. With such a configuration, even if a large tolerance in dimensional accuracy of the main word line is allowed, there can be ensured stable-yield manufacture of a semiconductor storage device. Accordingly, according to the former DWL storage device, there can be ensured stable-yield manufacture of a higher-integration semiconductor storage device having higher-density word lines.

However, in the former DWL storage device, the sub-word lines (including SWL<0> to SWL<7>) receive the boost voltage Vpp or the ground voltage Vss at one end of the memory bank, and being open-ended at the other end of the memory bank. Further, the even-numbered sub-word lines, which are open-ended at one end of the memory bank, and the odd-numbered sub-word lines, which are open-ended at the other end of the memory bank are alternately disposed in order to efficiently provide the N-type MOS transistor 16 and the transistor pair 20 in the sub-decoder regions (including the sub-decoder bands 12 and 14).

With the foregoing structure, as indicated by A part and B part in FIG. 7, the open ends of some sub-word lines locates near voltage-receiving ends of other sub-word lines. When the sub-word line receives the boost voltage Vpp, the voltage-receiving end has the highest voltage among all portions of the sub-word line. On the other hand, when the sub-word line is grounded, the open end is the most susceptible to noise among all portions of the sub-word line.

For these reasons, since the open ends of the sub-word lines are coupled with the voltage-receiving ends of the adjacent sub-word lines, the open ends of the sub-word lines are susceptible to superimposition of noise. When noise is superimposed on the open end of an inactivated sub-word line as a result of activation of other certain sub-word line, data stored in the memory cell corresponding to the inactivated sub-word line may be corrupted.

Further, the former DWL storage device allows the even-numbered sub-word lines SWL<0>, SWL<2>, SWL<4>, and SWL<6> to be brought into conduction with the common ground line 18 simultaneously while all of those lines are inactive. Similarly, the odd-numbered sub-word lines SWL<1>, SWL<3>, SWL<5>, and SWL<7> may be brought into conduction with the common ground line 26 while all of those lines are inactive.

When a certain sub-word line is changed between an active state and an inactive state, the sub-word line becomes recharged or discharged. When the sub-word line becomes recharged or discharged, noise is superimposed on the common ground line 18 or 26 connected to the sub-word line. The thus-superimposed noise is then transmitted to other sub-word lines connected to the common ground line 18 or 26. At this time, if the noise superimposed on the sub-word line exceeds the threshold voltage of the memory cell corresponding to the sub-word line, the data stored in the memory cell may be corrupted.

As mentioned previously, the former DWL storage device has the advantage of ensuring high-yield manufacture of a storage device under requirements for high-density circuitry. In contrast, the former device has a disadvantage of readily corrupting data of non-designated memory cells when a certain sub-word line is brought into an active state following a designation of a row address, or when the sub-word line is brought into an inactive state.

SUMMARY OF THE INVENTION

The present invention has been conceived to solve the previously-mentioned problems, and a general object of the present invention is to provide a novel and useful semiconductor storage device having a divided word line structure.

A more specific object of the present invention is to provide a semiconductor storage device which effectively prevents corruption of data stored in memory cells when an irrelevant sub-word line is brought into activation or in activation.

The above object of the present invention is achieved by a semiconductor storage device having a divided word line structure including a plurality of sub-word lines each having an open end and a main word line provided so as to be shared among the plurality of sub-word lines. The semiconductor storage device includes a decoder which selectively supplies a high or low potential to a predetermined portion of each sub-word line according to whether or not the sub-word line corresponds to a designated address. The semiconductor storage device also includes switching devices capable of connecting the open ends of the plurality of sub-word lines to a ground potential.

The above object of the present invention is also achieved by a semiconductor storage device having a divided word line structure including a plurality of sub-word lines each having an open end and a main word line provided so as to be shared among the plurality of sub-word lines. The semiconductor storage device includes sub-decode lines and reverse sub-decode lines provided so as to correspond to the respective sub-word lines corresponding to the same main word line. The semiconductor storage device includes a common ground line provided so as to be shared among the plurality of sub-word lines. The semiconductor storage device includes a first decoder which selectively supplies a high or low potential to the sub-decode line according to whether or not the address of a corresponding sub-word line is designated, and supplies to the reverse sub-decode line a potential which is the reverse of the potential supplied to the sub-decode line. The semiconductor storage device further includes a second sub-decoder which receives the potentials supplied to the sub-decode line or the reverse sub-decode line and selectively causes a corresponding sub-word line to receive a high voltage signal or to be connected to the common ground line. The common ground line passes through substantially the center between the sub-decode line and the reverse sub-decode line, both corresponding to the same sub-word line.

The above object of the present invention is also achieved by a semiconductor storage device having a divided word line structure including a plurality of sub-word lines each having an open end and a main word line provided so as to be shared among the plurality of sub-word lines. The semiconductor storage device includes sub-decode lines and reverse sub-decode lines provided so as to correspond to the respective sub-word lines corresponding to the same main word line. The semiconductor storage device includes a common ground line provided so as to be shared among the plurality of sub-word lines. The semiconductor device also includes a first decoder which selectively supplies a high or low potential to the sub-decode line according to whether or not the address of a corresponding sub-word line is designated, and supplies to the reverse sub-decode line a potential which is the reverse of the potential supplied to the sub-decode line. The semiconductor storage device further includes a second sub-decoder which receives the potentials supplied to the sub-decode line or the reverse sub-decode line and selectively causes a corresponding sub-word line to receive a high voltage signal or to be connected to the common ground line. Two lines of the plurality of sub-decode lines and reverse sub-decode lines corresponding to the plurality of sub-word lines, which are not simultaneously supplied with a high potential are provided so as to become adjacent to each other. The common ground line passes through substantially the center between the two adjacently-positioned lines.

Other objects and further features of the present invention will be apparent from the following detailed description when read in conjunction with the accompanying drawings.

DESCRIPTION OF THE PREFERRED EMBODIMENTS

Figure 1:
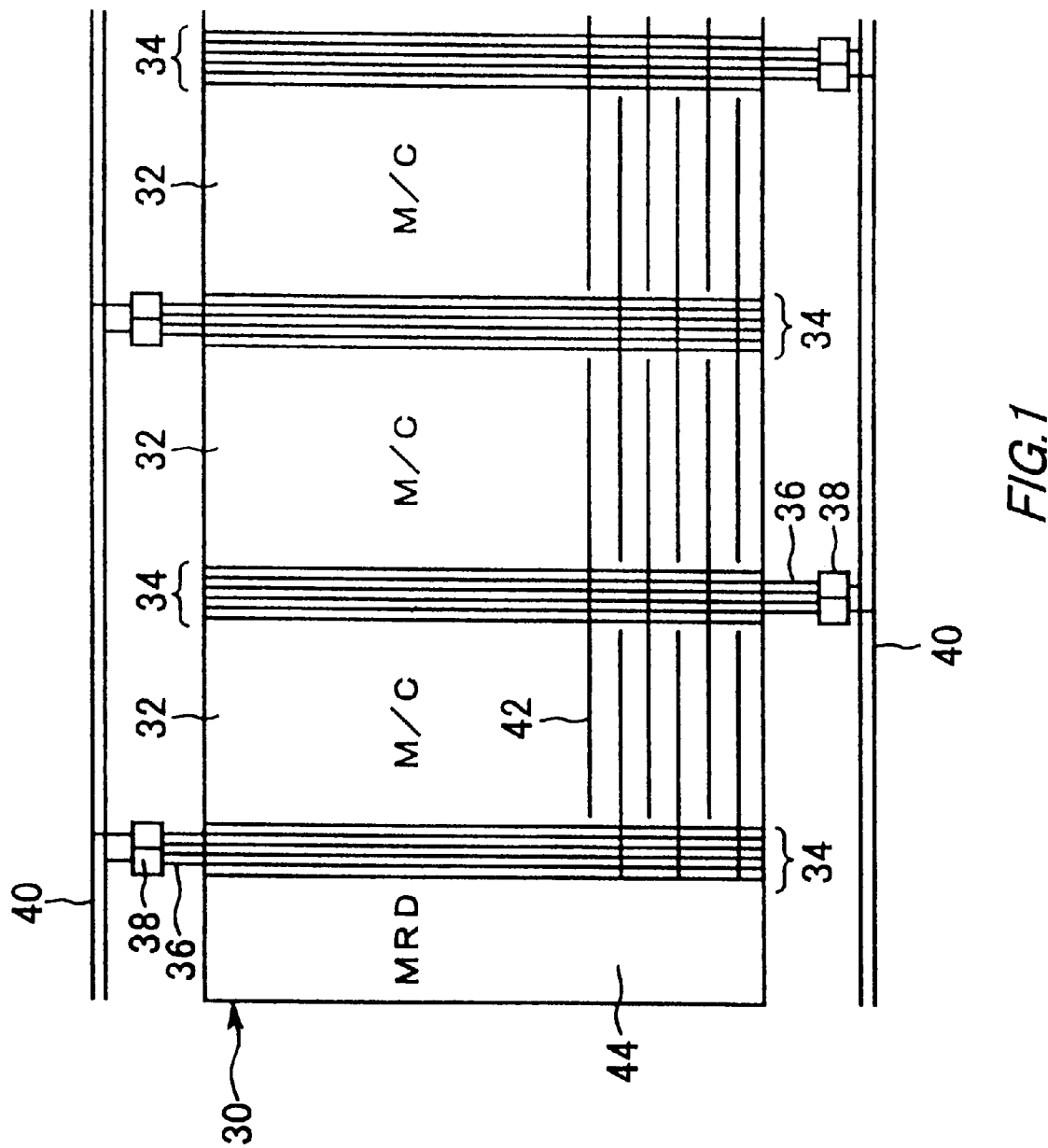
FIG. 1 is a plane view showing a part of a semiconductor storage device having a divided word line structure (DWL storage device) practiced as a first embodiment of the present invention.

In the following, principles and embodiments of the present invention will be described with reference to the accompanying drawings. Through the drawings, common elements are assigned the same reference numerals and the repetition of explanation thereof will be omitted.

First Embodiment

FIG. 1 shows a portion of a semiconductor storage device having a divided-word line structure 30 (hereinafter referred to simply as a "DWL storage device 30") practiced as a first embodiment of the present invention. The DWL storage device 30 comprises a plurality of memory banks 32. In each memory bank 32, a plurality of memory cells are provided two-dimensionally. The DWL storage device 30 writes data into or read data from a certain memory cell when predetermined procedures including designation of a row address and a column address are performed.

The DWL storage device is provided with sub-decoder bands 34 each of which is disposed to either side of each memory bank 32. Four decode lines 36 are provided in each sub-decoder band 34 so as to pass longitudinally through the same. The decode lines 36 are connected to an address line 40 by way of a sub-decoder driver (SD driver) 38. The address line 40 receives decode signals corresponding to the address of a certain memory cell. The SD driver 38 supplies an appropriate potential to the individual decode lines 36 upon receipt of the decode signal.

The DWL storage device 30 has a plurality of sub-word lines 42. Each of the sub-word lines 42 overlaps with the sub-decoder band 34 at one side of each memory cell 32 and is open-ended in the vicinity of the other side edge of the memory cell 32. In the area where the sub-word lines 42 and the sub-decoder band 34 overlap each other, the sub-word lines 42 are provided so as to be connectable with a single decode line 36. The sub-word lines 42 overlapping with the sub-decoder band 34 at one side edge of the memory cell 32 and the sub-word lines 42 overlapping with the other sub-decoder band 34 at the other side edge of the same memory cell 32 are formed so as to be alternately positioned in the same sub-decoder band.

The DWL storage device 30 has a main row decoder (MRD) 44. As will be described later, a plurality of main word lines are formed in the DWL storage device 30. The plurality of main word lines are provided so as to traverse all the memory cells 32 and the sub-decoder bands 34 which are disposed parallel to the MRD 44. The MRD 44 supplies the boost potential Vpp or the ground potential Vss to the individual main word lines upon receipt of a row address of the memory cell to be activated.

Figure 2:
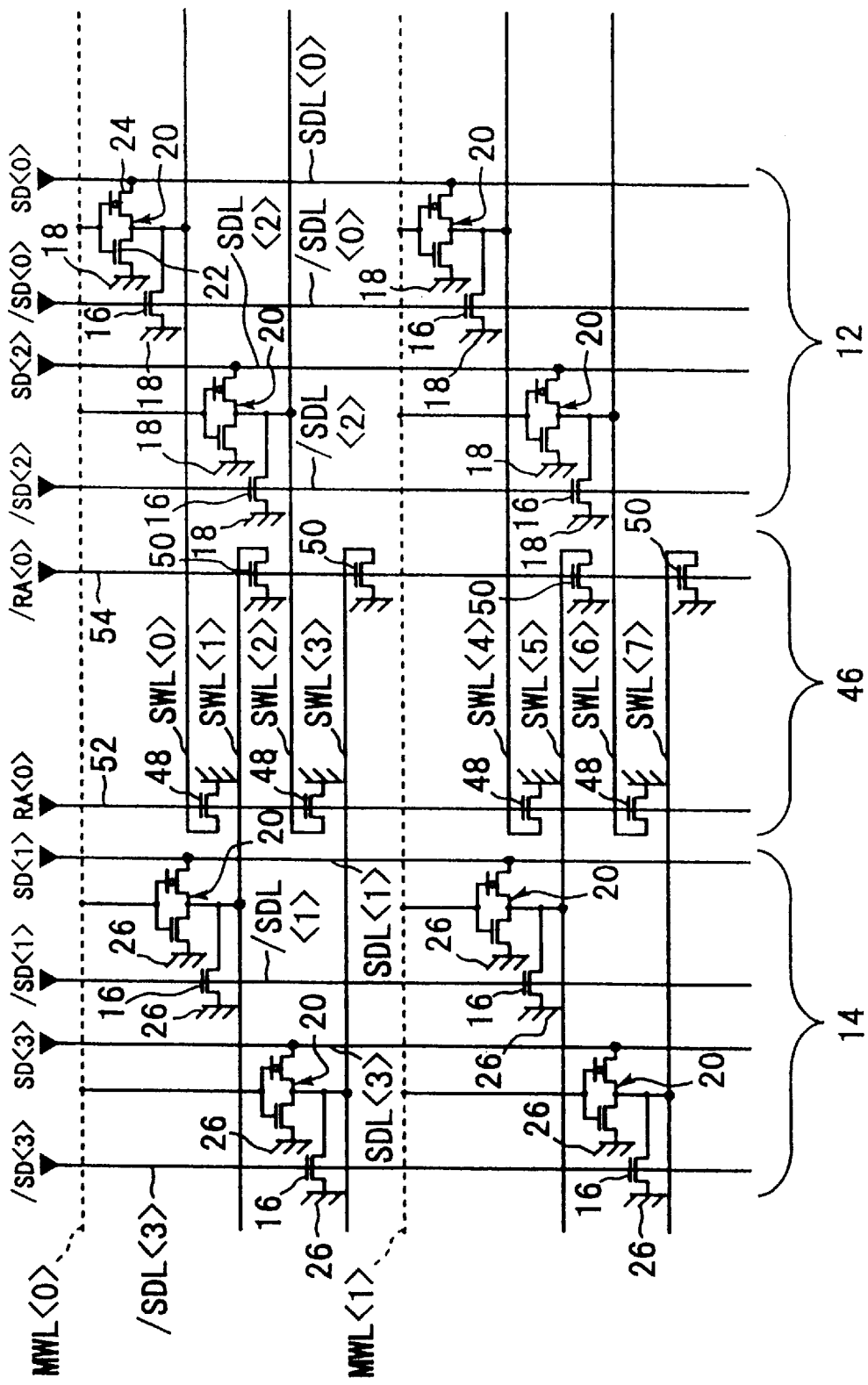
FIG. 2 is a circuit diagram showing principal elements of the DWL storage device shown in FIG. 1.
Figure 7:
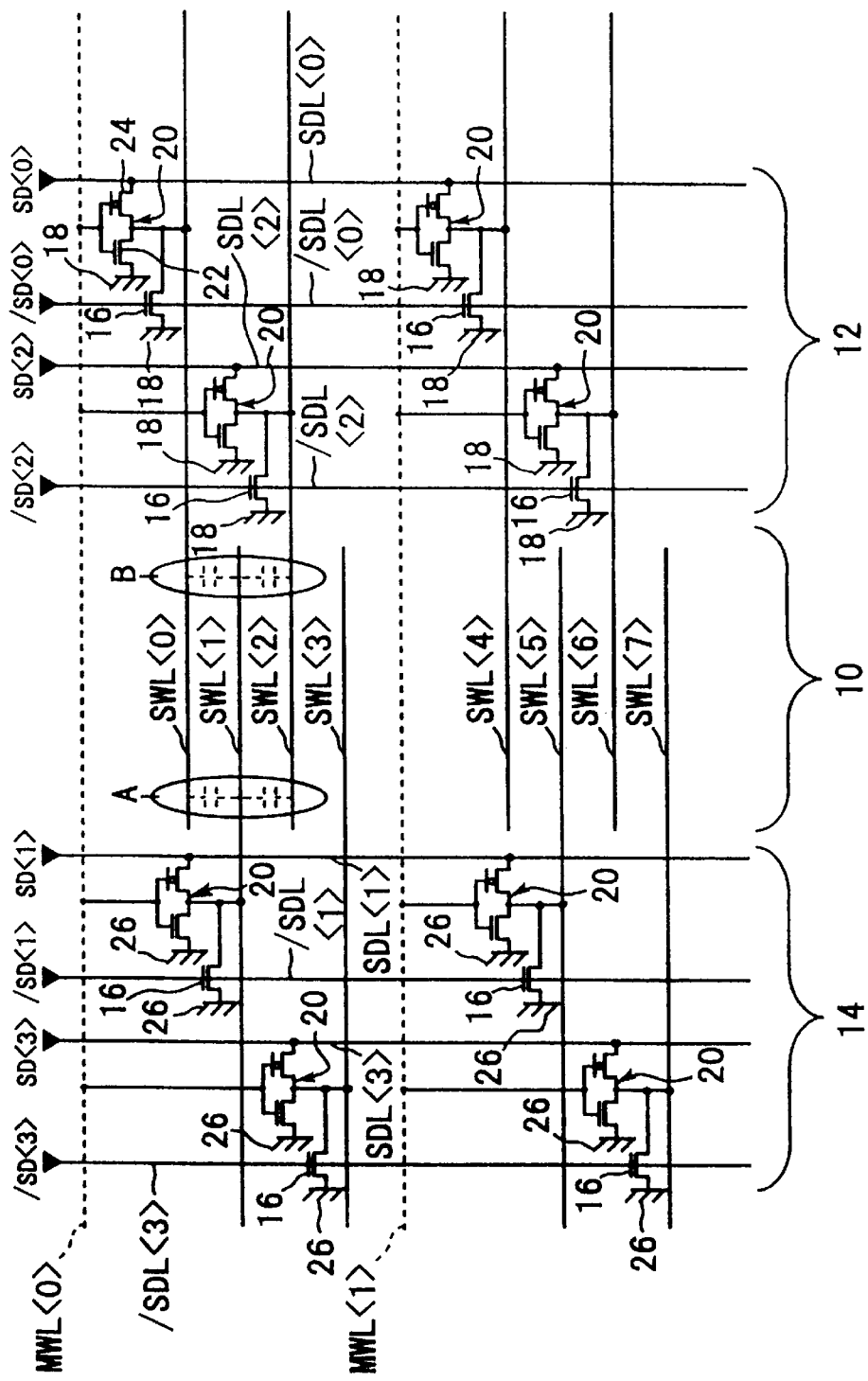
FIG. 7 is a circuit diagram showing principal elements of a former DWL storage device.

FIG. 2 is a circuit diagram showing the principal elements of the DWL storage device 30 practiced as the first embodiment. In FIG. 2, those elements which are the same as those shown in FIG. 7 will be described while being assigned the same reference numerals.

A memory bank region 46 shown in FIG. 2 is a portion of the memory bank 32 shown in FIG. 1. Likewise, the sub-decoder bands 12 and 14 shown in FIG. 2 are portions of the sub-decoder bands 34 shown in FIG. 1.

As mentioned previously, the DWL storage device 30 practiced as the first embodiment comprises the plurality of main word lines (MWL). MWL<0> and MWL<1> shown in FIG. 2 are portions of these main word lines and are provided so as to extend and pass through the sub-decoder bands 12 and 14 and the memory bank region 46. MWL<0> and MWL<1> are made of an aluminum wiring pattern provided above memory cells or the like.

As mentioned above, the DWL storage device 30 comprises the plurality of sub-word lines (SWL) 42. SWL<0> to SWL<7> shown in FIG. 2 are portions of the sub-word lines, which are transfer gates formed from polysilicon and disposed below MWL<0> and MWL<1>. SWL<0> to SWL<3> are provided so as to correspond to MWL<0>, and SWL<4> to SWL<7> are provided so as to correspond to MWL<1>. Hereinafter, SWL<0> to SWL<3> and SWL<4> to SWL<7>will be described as "the same group SWLs", respectively. In the first embodiment, MWL<0>, MWL<1>, and SWL<0> to SWL<7> are used for designating the row address of the memory cell.

As mentioned previously, the four decode lines 36 are formed in each of the sub-decoder bands 34 (including the sub-decoder bands 12 and 14) in the DWL storage device 30. Two sub-decode lines SDL<0> and SDL<2> and two reverse sub-decode lines /SDL<0> and /SDL<2> shown in FIG. 2 serve as the decode lines 36 formed in the sub-decoder band 12. Further, two sub-decode lines SDL<1> and SDL<3> and two reverse sub-decode lines /SDL<1> and /SDL<3> shown in FIG. 2 serve as the decode lines 36 formed in the sub-decoder band 14.

The sub-decode lines SDL<0> to SDL<4> are supplied with corresponding sub-decode signals SD<0> to SD<4> from the SD driver (shown in FIG. 1) 38. Likewise, the reverse sub-decode lines /SDL<0> to /SDL<4> are supplied with corresponding reverse sub-decode signals /SD<0> to /SD<4> from the SD driver 38.

SWL<0>, SWL<2>, SWL<4>, and SWL<6> are sub-word lines, each of which has an open end in the vicinity of the sub-decoder band 14. These sub-word lines will be hereinafter referred to as "even-numbered sub-word lines." On the other hand, SWL<1>, SWL<3>, SWL<5>, and SWL<7> are sub-word lines, each of which has an open end in the vicinity of the sub-decoder band 12. These sub-word lines will be hereinafter referred to as "odd-numbered sub-word lines."

SWL<0> is connected to the even-numbered common ground line 18 by way of the N-type MOS transistor 16, as well as to the even-numbered common ground lines 18 and SDL<0> by way of the transistor pair 20. The gate of the N-type MOS transistor 16 is connected to /SDL<0>. The transistor pair 20 comprises an N-type MOS transistor 22 and a P-type MOS transistor 24. MWL<0> is connected to the gate of the N-type MOS transistor 22 and to the gate of the P-type MOS transistor 24.

As in the case of SWL<0>, the even-numbered sub-word line SWL<2> is connected to the even-numbered common ground line 18 and MWL<0> by way of the N-type MOS transistor 16 and the transistor pair 20; and the even-numbered sub-word lines SWL<4> and SWL<6> are connected to the even-numbered common ground line 18 and MWL<1> by way of the N-type MOS transistor 16 and the transistor pair 20. In contrast, the odd-numbered sub-word lines SWL<1> and SWL<3> are connected to the odd-numbered common ground line 26 and MWL<D> by way of the N-type MOS transistor 16 and the transistor pair 20; and the odd-numbered sub-word lines SWL<5> and SWL<7> are connected to the odd-numbered common ground 26 and MWL<1> by way of the N-type MOS transistor 16 and the transistor pair 20.

In the DWL storage device 30 according to the first embodiment, the open ends of the even-numbered sub-word lines SWL<0>, SWL<2>, SWL<4>, and SWL<6> are grounded by way of N-type MOS transistors 48. Further, the open ends of the odd-numbered sub-word lines SWL<1>, SWL<3>, SWL<5>, and SWL<7> are grounded by way of N-type MOS transistors 50. The gate of each N-type MOS transistor 48 corresponding to one of the even-numbered sub-word lines is connected to a first drive line 52. In contrast, the gate of each N-type MOS transistor corresponding to one of the odd-numbered sub-word lines is connected to a second drive line 54.

The first drive line 52 is supplied with a decode signal RA<0>, and the second drive line 54 is furnished with a reverse signal of the decode signal RA<0>, i.e., /RA<0>. RA<0> corresponds to a least significant bit of a signal representing a row address. When the row address corresponds to the odd-numbered sub-word line, RA<0> is brought into the boost potential Vpp. In contrast, when the row address corresponds to the even-numbered sub-word line, RA<0> is brought into the ground potential Vss. Accordingly, when the row address corresponds to the odd-numbered sub-word line, the reverse signal /RA<0> is brought into the ground potential Vss. When the row address corresponds to the even-numbered sub-word line, /RA<0> is brought into the boost potential Vpp.

The operation of the DWL storage device 30 according to the first embodiment will now be described.

When the designated row address corresponds to any of SWL<0> to SWL<3>, the MRD 44 (see FIG. 1) of the DWL storage device 30 supplies the boost potential Vpp to MWL<0>. In contrast, when the designated row address does not correspond to any one of SWL<0> to SWL<3>, the MRD 44 keeps MWL<0> at a ground potential GND. Similarly, when the designated row address corresponds to any of SWL<4> to SWL<7>, the MRD 44 supplies the boost potential Vpp to MWL<1>. In contrast, when the designated row address does not correspond to any one of SWL<4> to SWL<7>, the main row decoder keeps MWL<1> at the ground potential Vss.

In the DWL storage device 30, when the designated row address corresponds to the sub-word line which is belongs to the even-numbered sub-word line and is assigned the lowest reference numeral among the same group SWLs (e.g., SWL<0> or SWL<4>), the sub-decode signal SD<0> is brought to the boost potential Vpp, and the reverse sub-decode signal /SD<0> is brought to the ground potential Vss. At this time, the other sub-decode signals SD<1> to SD<3> are maintained at the ground potential Vss, and the other reverse sub-decode signals /SD<1> to /SD<3> are maintained at the boost voltage Vpp.

When the designated row address corresponds to SWL<2> or SWL<6>, SDL<2> receives the boost potential Vpp, and /SDL<2> receives the ground potential Vss. In contrast, when the designated row address corresponds to SWL<1> or SWL<5>, the corresponding sub-decode line (i.e., SDL<1>) receives the boost voltage Vpp, and the corresponding reverse sub-decode line (i.e., /SD<1>) receives the ground potential Vss. Likewise, when the designated row address corresponds to SWL<3> or SWL<7>, the corresponding sub-decode line (i.e., SDL<3>) receives the boost voltage Vpp, and the corresponding reverse sub-decode line (i.e., /SDL<3>) receives the ground potential Vss.

For example, in the DWL storage device 30, when the row address corresponding to SWL<0> is designated, MWL<0> is changed to the ground potential Vss from the boost voltage Vpp. As a result, the P-type MOS transistor of the transistor pair 20 is activated, and SWL<0> and SDL<0> are brought into conduction. Further, as a result of designation of the row address, SD<0> is brought to the boost potential Vpp, and /SD<0> is brought into the ground potential Vss. In this case, the boost potential Vpp is transmitted to SWL<0> from SDL<0> while the N-type MOS transistor 16 is deactivated. As a result, SWL<0> is brought into a high potential.

When the row address is designated, SWL<1> and SWL<3> are each connected to the common ground line 26 by way of the N-type MOS transistor 16, and SWL<2> is connected to the common ground line 18 by way of the N-type MOS transistor 16. Further, SWL<1> to SWL<3> are connected to SDL<1>, SDL<2>, and SDL<3> by way of the respective transistor pairs 20. At this time, the ground potential Vss is supplied to SDL<1> to SDL<3>. Accordingly, SWL<1> to SWL<3> are maintained at the ground potential Vss.

When the row address is designated, SWL<4> is connected to the common ground line 18 by way of the transistor pair 20. Further, in this circumstance, SWL<5> and SWL<7> are each connected to the common ground line 26 by way of the N-type MOS transistor 16 and the transistor pair 20, and SWL<6> is connected to the common ground line 18 by way of the N-type MOS transistor 16 and the transistor pair 20. Accordingly, SWL<5> to SWL<7> are maintained at the ground potential Vss. As mentioned above, the DWL storage device according to the first embodiment enables selective activation of only the sub-word line corresponding to the designated address.

When the row address corresponding to the even-numbered sub-word line is designated, the signal /RA<0> fed to the N-type MOS transistor 50 corresponding to the odd-numbered sub-word line is brought to the boost potential Vpp. Because of this, when the row address is designated, the open ends of the odd-numbered sub-word lines SWL<1>, SWL<3>, SWL<5>, and SWL<7> are grounded.

When any of the even-numbered sub-word lines is activated while the open ends of the odd-numbered sub-word lines are disconnected from the ground potential, an odd-numbered sub-word line adjacent to the activated sub-word line may be readily affected with noise stemming from coupling between the adjacent sub-word lines. In contrast, when the open end of the odd-numbered sub-word line is grounded when any of the even-numbered sub-word lines is activated, the noise to be superimposed on the odd-numbered sub-word line is effectively reduced. For these reasons, the DWL storage device 30 effectively prevents corruption of the data stored in the memory cells corresponding to the odd-numbered sub-word lines, which would otherwise be caused by activation of any of the even-numbered sub-word lines.

Similarly, the DWL storage device 30, when the row address corresponding to any of the odd-numbered sub-word lines is designated, activates the odd-numbered sub-word line while the open end of the even-numbered sub-word line is grounded. Accordingly, even in this case, the DWL storage device 30 effectively prevents corruption of the data stored in the memory cells corresponding to the even-numbered sub-word line, which would otherwise be caused by activation of the odd-numbered sub-word line. Thus, the DWL storage device 30 according to the first embodiment, which employs the divided word line structure, ensures superior resistance to corruption of the data stored in the memory cells.

Second Embodiment

A second embodiment of the present invention will now be described by reference to FIG. 3.

Figure 3:
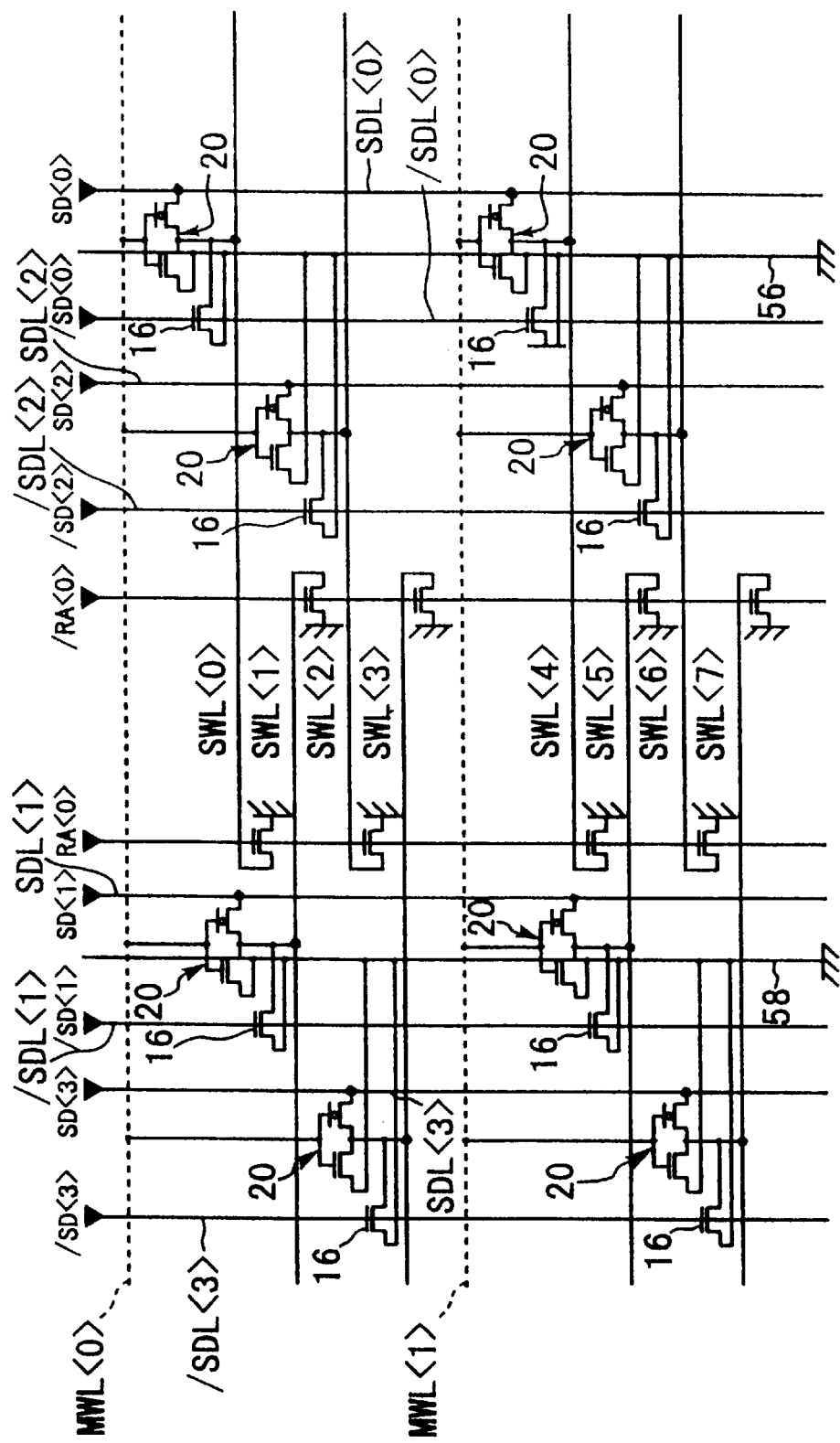
FIG. 3 is a circuit diagram showing principal elements of a DWL storage device practiced as a second embodiment of the present invention.

FIG. 3 is a circuit diagram showing the principal elements of the DWL storage device according to the second embodiment. The DWL storage device according to the second embodiment is equal in structure to the DWL storage device 30 according to the first embodiment except that the device according to the second embodiment comprises common ground lines 56 and 58 in place of the common ground lines 18 and 26 shown in FIG. 2. The DWL storage device according to the second embodiment is characterized in that the common ground line 56 is formed substantially in the center between SDL<0> and /SDL<0> and the common ground line 58 is formed substantially in the center between SDL<1> and /SDL<1>.

Each of the even-numbered sub-word lines SWL<0>, SWL<2>, SWL<4>, and SWL<6> is connected to the common ground line 56 by way of the N-type MOS transistor 16 and the transistor pair 20. Similarly, each of the odd-numbered sub-word lines SWL<1>, SWL<3>, SWL<5>, and SWL<7> is connected to the common ground line 58 by way of the N-type MOS transistor 16 and the transistor pair 20.

When one of the even-numbered sub-word lines is changed to an active state from an inactive state or to an inactive state from an active state, the potential of the pair of decode lines corresponding to the sub-word line (e.g., the pair consisting of SDL<0> and /SDL<0> or the pair consisting of SDL<2> and /SDL<2>) is inverted so that the sub-word line becomes recharged or discharged.

If the electrical environment of the common ground line 56 is greatly changed as in association with the foregoing processing operations, noise stemming from the processing operations may be superimposed on the common ground line 56. If a great amount of noise is superimposed on the common ground line 56, a memory cell to be maintained in an inactive state may be unduly activated, which may causes corruption of the data stored in that memory cell. Similarly, if the electrical environment of the common ground line 58 corresponding to the odd-numbered sub-word lines is unstable, a change in the active state of any of the odd-numbered sub-word lines may cause corruption of the data stored in a memory cell irrelevant to the change. For these reasons, in order to prevent corruption of the data stored in the memory cells in the DWL storage device, it is important to stabilize the electrical environment of the common ground lines 56 and 58.

As mentioned above, in the DWL storage device according to the second embodiment, the common ground line 56 is provided in substantially the center between SDL<0> and /SDL<0>. The ground potential Vss is always supplied to one of SDL<0> and /SDL<0> as well as the boost potential Vpp is always supplied to the other. In this case, the electrical environment of the common ground line 56 is stably maintained without being affected by the reverse of the potential fed to SDL<0> and /SDL<0>.

Similarly, the common ground line 58 is provided in substantially the center between SDL<1> and /SDL<1>. The ground potential Vss is always supplied to one of SDL<1> and /SDL<1> as well as the boost voltage Vpp is always supplied to the other. Accordingly, the electrical environment of the common ground line 58 is also stably maintained.

As mentioned above, the common ground line 56 corresponding to the even-numbered sub-word lines and the common ground line 58 corresponding to the odd-numbered sub-word lines are formed in electrically-stable positions. Therefore, the DWL storage device according to the second embodiment ensures superior resistance to corruption of the data stored in the memory cells while employing a common ground line for a plurality of even-numbered sub-word lines and a common ground line for a plurality of odd-numbered sub-word lines.

Third Embodiment

A third embodiment of the present invention will now be described by reference to FIG. 4.

Figure 4:
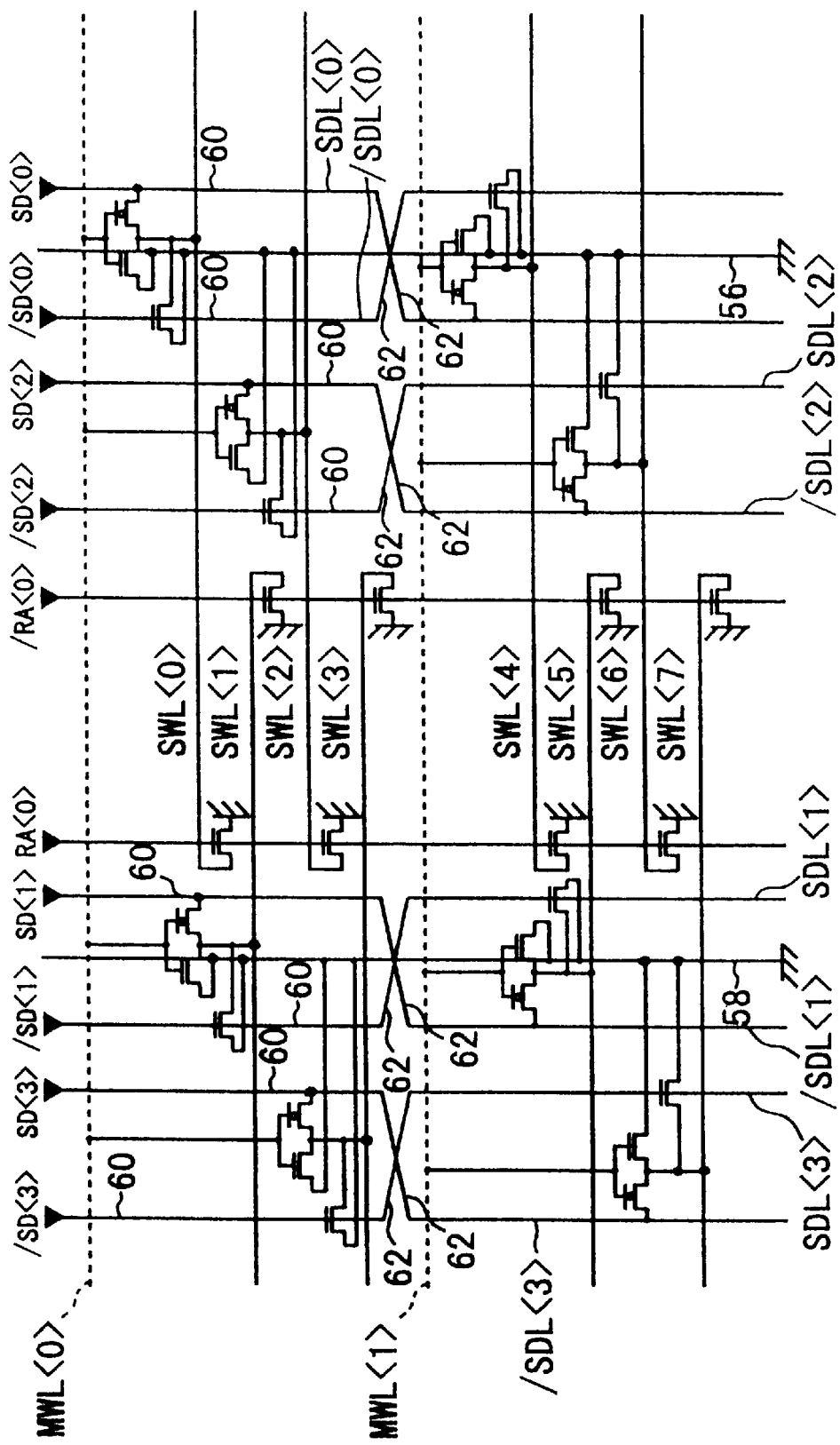
FIG. 4 is a circuit diagram showing principal elements of a DWL storage device practiced as a third embodiment of the present invention.

FIG. 4 is a circuit diagram showing the principal elements of a DWL storage device according to the third embodiment. The DWL storage device according to the third embodiment is equal in structure to the DWL storage device according to the second embodiment except that each of a pair consisting of sub-decode lines SDL<0> and /SDL<0>, a pair consisting of sub-decode lines SDL<1> and /SDL<1>, a pair consisting of sub-decode lines SDL<2> and /SDL<2>, and a pair consisting of sub-decode lines SDL<3> and /SDL<3> has a parallel portion 60 and a crossing section 62. The DWL storage device according to the third embodiment is characterized in that the each pair of sub-decode lines between which the common ground line 56 or 58 is provided (e.g., the pair of SDL<0> and /SDL<0> or the pair of SDL<1> and /SDL<1>) are changed in position at the crossing section 62.

The DWL storage device according to the second embodiment (see FIG. 3) is designed so that the common ground line 56 is provided substantially in the center between SDL<0> and /SDL<0> and the common ground line 58 is provided substantially in the center between SDL<1> and /SDL<1> in order to stabilize the electrical environment of the common ground lines 56 and 58. However, the foregoing structure may causes the electrical environment to be unstable if the position of the common ground lined 56 or 58 is displaced.

For example, if the position of the common ground line 56 is displaced toward SDL<0> in relation to the center between SDL<0> and /SDL<0>, the potential of the common ground line 56 sifts toward the boost potential Vpp when the SDL<0> is held in the boost potential Vpp (while /SDL<0> is held in the ground potential Vss) compared to a potential which is obtained when the /SDL<0> is held in the boost potential Vpp (while SDL<0> is held in the ground potential Vss).

In contrast, according to the present embodiment, the positions of SDL<0> and /SDL<0> are switched at the crossing section 62. Accordingly, even if the position of the common ground line 56 is shifted toward SDL<0> or /SDL<0>, the influence stemming from the shift will be canceled. The cancellation effect similarly arises in the common ground line 58 provided in the center between SDL<1> and /SDL<1>. Therefore, the third embodiment provides more stable electric environment when compared with the second embodiment. The DWL storage device according to the third embodiment, therefore, ensures superior resistance to corruption of the data stored in the memory cells.

Fourth Embodiment

A fourth embodiment of the present invention will now be described by reference to FIG. 5.

Figure 5:
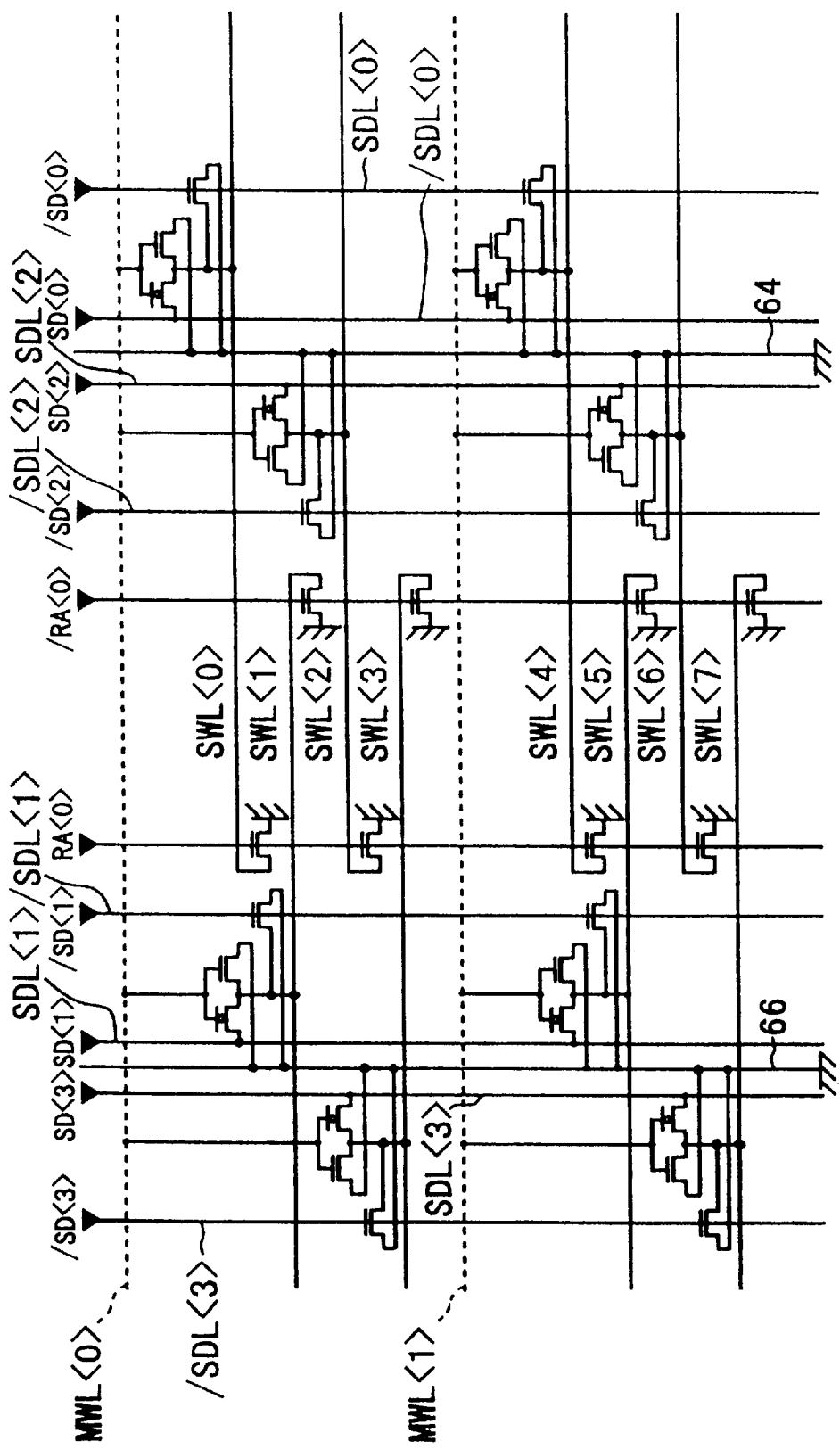
FIG. 5 is a circuit diagram showing principal elements of a DWL storage device practiced as a fourth embodiment of the present invention.

FIG. 5 is a circuit diagram showing the principal elements of a DWL storage device according to the fourth embodiment. The DWL storage device according to the fourth embodiment is equal in structure to the DWL storage device 30 according to the first embodiment, except that two of sub-decode lines, i.e.,. SDL<0> and SDL<2>, as well as SDL<1> and SDL<3>, are provided so as to become adjacent to each other, and common ground lines 64 and 66 are used in place of the common ground lines 18 and 26. The DWL storage device according to the fourth embodiment is characterized in that the common ground line 64 is interposed between SDL<0> and SDL<2> as well as the common ground line 66 is interposed between SDL<1> and SDL<3>.

In the DWL storage device according to the fourth embodiment, there is no demand for simultaneous activation of two pairs of decode lines corresponding to the even-numbered sub-word lines, i.e., a pair consisting of SDL<0> and /SDL<0> and a pair consisting of SDL<2> and /SDL<2>. Therefore, SDL<0> and SDL<2> are not concurrently brought to the boost voltage Vpp.

Similarly, there is no demand for simultaneous activation of two pairs of decode lines corresponding to the odd-numbered sub-word lines, i.e., a pair consisting of SDL<1> and /SDL<1> and a pair consisting of SDL<3> and /SDL<3>. Therefore, SDL<1> and SDL<3> are not concurrently brought to the boost voltage Vpp.

In a case where each of the common ground lines 64 and 66 is provided between two lines which are simultaneously brought into the boost voltage Vpp, when the two lines are simultaneously brought into the boost voltage Vpp, the common ground lines 64 and 66 have large potentials and are likely to shift toward the boost voltage Vpp. In contrast, in a case where each of the common ground lines 64 and 66 is provided between two lines which are not simultaneously brought into the boost voltage Vpp, the extent of shift arising in the potentials of the common ground lines 64 and 66 can be reduced. For this reason, the DWL storage device according to the fourth embodiment can ensure superior resistance to corruption of the data stored in the memory cells.

Fifth Embodiment

A fifth embodiment of the present invention will now be described by reference to FIG. 6.

Figure 6:
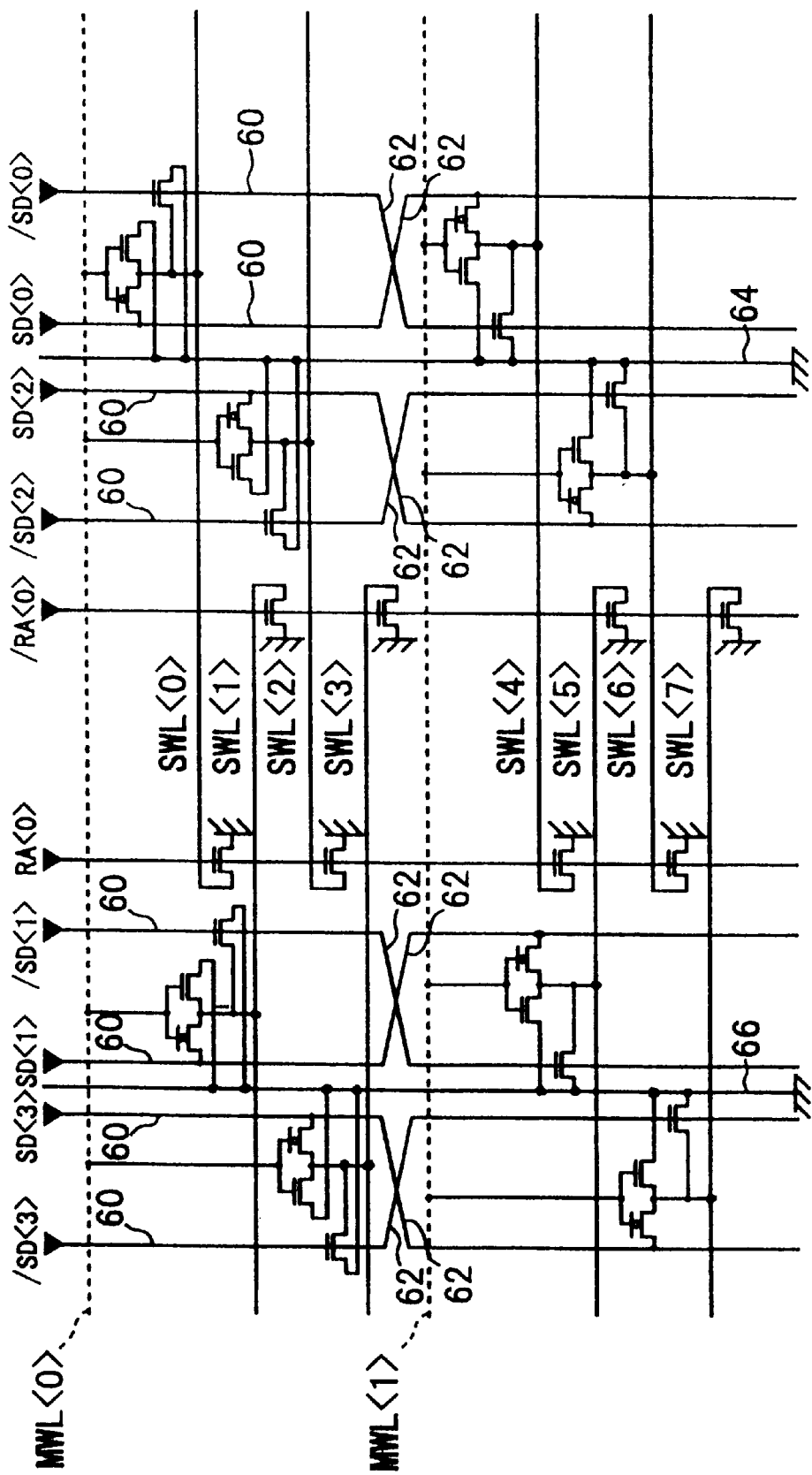
FIG. 6 is a circuit diagram showing principal elements of a DWL storage device practiced as a fifth embodiment of the present invention.

FIG. 6 is a circuit diagram showing the principal elements of a DWL storage device according to the fifth embodiment. The DWL storage device according to the fifth embodiment is equal in structure to the DWL storage device according to the fourth embodiment, except that each of a pair consisting of sub-decode lines SDL<0> and /SDL<0>, a pair consisting of sub-decode lines SDL<1> and /SDL<1>, a pair consisting of sub-decode lines SDL<2> and /SDL<2>, and a pair consisting of sub-decode lines SDL<3> and /SDL<3> has parallel portions 60 and crossing portions 62. The DWL storage device according to the fifth embodiment is characterized in that each of the sub-decode lines SDL<0> to SDL<3>, which is provided on one side of the common ground line 64 or 66, is changed in position with each of the corresponding reverse sub-decode lines /SDL<0> to /SDL<3>, which is provided on the other side of the common ground line 64 or 66, at the crossing portions 62.

In the foregoing structure, SDL<0> and /SDL<0> alternately appear on one side of the common ground line 64 (i.e., the right-side in FIG. 6). Accordingly, the area where a potential is constantly maintained at the booster potential Vpp and the area where a potential is constantly maintained at the ground potential Vss are each formed on one side of the common ground line 64 over an equal distance (i.e., half the entire length of the common ground line 64). Likewise, SDL<2> and /SDL<2> alternately appear on the other side of the common ground line 64 (i.e., the left-side in FIG. 6). Accordingly, the area where a potential is constantly maintained at the booster potential Vpp and the area where a potential is constantly maintained at the ground potential Vss are formed on the other side of the common ground line 64 over an equal distance (i.e., half the entire length of the common ground line 64).

Accordingly, the electrical environment of the common ground line 64 becomes stable without regard to the potential of the two sub-decode lines in each pair. In the foregoing DWL storage device, the above-mentioned electrical environment is also formed around the common ground line 66. Therefore, the DWL storage device according to the fifth embodiment ensures a stable electrical environment around the common ground lines 64 and 66, preventing superimposition of noise to the common ground lines 64 and 66. The DWL storage device according to the fifth embodiment, therefore, enables superior resistance to corruption of the data stored in the memory cells.

The major benefits of the present invention described above are summarized as follows:

According to a first aspect of the present invention, a sub-word line corresponding to a designated address can be brought into a high potential state while the open end of a sub-word line irrelevant to the designated address can be grounded by way of a switching device. Therefore, the noise superimposed on the open end of the sub-word line irrelevant to the designated address is prevented, thus effectively preventing corruption of the data stored in the memory cell.

According to a second aspect of the present invention, sub-word lines pertaining to a first sub-word line group (which are open ended near one side of a memory bank) and sub-word lines pertaining to a second sub-word line group (which are open ended near the other side of the memory bank) are alternately provided. The constituent elements of the semiconductor storage device, therefore, are efficiently arranged. Further, the invention causes the open ends of the sub-word lines pertaining to the second sub-word line group to be grounded when a high voltage is fed to the sub-word line pertaining to the first sub-word line group. Likewise, the invention causes the open ends of the sub-word lines pertaining to the first sub-word line group to be grounded when a high voltage is fed to the sub-word line pertaining to the second sub-word line group. Accordingly, although the voltage-receiving portions of sub-word lines are positioned in the vicinity of open ends of another sub-word liens, the data stored in the memory cells are effectively protected from corruption.

According to a third aspect of the present invention, a switching device can be properly driven by utilization of a decode signal produced at the time of activation of the sub-word line corresponding to the designated address. According to the present invention, therefore, there is no need to newly produce a signal for driving switching devices, thus implementing a desired function without involving a complex structure of a semiconductor storage device.

According to a fourth aspect of the present invention, a common ground line provided so as to be shared among a plurality of sub-word lines passes through substantially the center between a sub-decode line and a reverse sub-decode line, both corresponding to the same sub-word line. A high potential is constantly fed to one of the paired sub-decode line and reverse sub-decode line, both corresponding to the same sub-word line, and a low potential is constantly fed to the other sub-decode line. Thus, if the potential of the sub-decode line and the potential of the reverse sub-decode line are inverted, the potential of the common ground line is not affected by such an inversion. According to the present invention, therefore, mutual interference among the plurality of sub-word lines connected to the same common ground line is prevented, thus effectively protecting the data stored in the memory cells from corruption.

According to a fifth aspect of the present invention, a sub-decode line and a reverse sub-decode line provided on opposite sides of the common ground line can be switched in position at a crossing portion. In a case where the sub-decode line and the reverse sub-decode line are fixedly positioned, if the common ground line is shifted toward either the sub-decode line or the reverse sub-decode line from the center therebetween, the common ground line is susceptible to the inversion of potential of the sub-decode line and potential of the reverse sub-decode line. According to the present invention, even if the common ground line is shifted toward either the sub-decode line or the reverse sub-decode line from the center therebetween, the inversion of potential does not affect the common ground line. The present invention, therefore, effectively protect the data stored in memory cells from corruption without being affected by the positional accuracy of the common ground line.

According to a sixth aspect of the present invention, a common ground line provided so as to be shared among a plurality of sub-word lines passes through substantially the center between two lines (e.g., a sub-decode line and a reverse sub-decode line) which are not simultaneously susceptible to the feeding of a high potential. In this case, a high voltage does not simultaneously arise on both sides of the common ground line. Thus, compared with a case where a high potential simultaneously arises on both sides of the common ground line, the noise superimposed on the common ground line can be prevented. Accordingly, the present invention prevents mutual interference among the plurality of sub-word lines connected to the same common ground line, thereby effectively protecting data from corruption.

According to a seventh aspect of the present invention, the two lines (e.g., a sub-decode line and a reverse sub-decode line) provided on opposite sides of the common ground line are switched in position at the crossing sections. As mentioned above, in a case where the two lines are switched in position at the crossing section, the length of the lines—in which a high potential arises in the vicinity of the common ground line—is about half the entire length of the lines on both sides of the common ground line under any circumstances. The present invention, therefore, effectively protects data stored in memory cells from corruption by stably maintaining the electrical environment of the common ground line.

Further, the present invention is not limited to these embodiments, but variations and modifications may be made without departing from the scope of the present invention.

The entire disclosure of Japanese Patent Application No. Hei10-204870 filed on Jul. 21, 1998 including specification, claims, drawings and summary are incorporated herein by reference in its entirety.

What is claimed is:

1. A semiconductor storage device having a divided word line structure, comprising:

a plurality of sub-word lines, each having an open end and a closed end;

a main word line provided so as to be shared among the plurality of sub-word lines by being connected to said closed end of each said sub-word line;

a decoder which selectively supplies a high or low potential to a predetermined portion of each sub-word line according to whether or not the sub-word line corresponding to a designated address; and switching devices capable of connecting the open ends of the plurality of sub-word lines to a ground potential.

2. The semiconductor storage device as defined in claim 1, wherein the plurality of sub-word lines comprise a first sub-word group in which each sub-word line has the predetermined portion near one end of a memory bank and the open end near the other end of the memory bank, and a second sub-word line group in which each sub-word line has the open end near the one end of the memory bank;

the sub-word lines pertaining to the first sub-word line group and the sub-word lines pertaining to the second sub-word line group are alternately provided within the memory bank; and said semiconductor storage device further comprising a switching device drive circuit which activates the switching device corresponding to the second sub-word line group when a high potential is supplied to the sub-word lines pertaining to the first sub-word line group and which activates the switching device corresponding to the first sub-word line group when a high potential is supplied to the sub-word lines pertaining to the second sub-word line group.

3. The semiconductor storage device as defined in claim 2, wherein the switching device drive circuit comprises:

a first drive line which guides to a switching device corresponding to a sub-word line pertaining to the second sub-word line group a predetermined decode signal arising at the time of designation of a sub-word line pertaining to the first sub-word line group; and a second drive line which guides to a sub-word line pertaining to the first sub-word line group a predetermined decode signal arising at the time of designation of a sub-word line pertaining to the second sub-word line group.

4. A semiconductor storage device having a divided word line structure including a plurality of sub-word lines each having an open end and a main word line provided so as to be shared among the plurality of sub-word lines, the semiconductor storage device comprising:

sub-decode lines and reverse sub-decode lines provided so as to correspond to the respective sub-word lines corresponding to the same main word line;

a common ground line provided so as to be shared among the plurality of sub-word lines;

a first decoder which selectively supplies a high or low potential to the sub-decode line according to whether or not the address of a corresponding sub-word line is designated, and supplies to the reverse sub-decode line a potential which is the reverse of the potential supplied to the sub-decode line; and a second sub-decoder which receives the potentials supplied to the sub-decode line or the reverse sub-decode line and selectively causes a corresponding sub-word line to receive a high voltage signal or to be connected to the common ground line, wherein the common ground line passes through substantially the center between the sub-decode line and the reverse sub-decode line, both corresponding to the same sub-word line.

5. The semiconductor storage device as defined in claim 4, wherein the sub-decode line and the reverse sub-decode line which are respectively provided on opposite sides of the common ground line comprise a parallel portion in which the sub-decode line and the reverse sub-decode line extend parallel to each other and a crossing portion at which the sub-decode line and the reverse sub-decode line are switched in position while the common ground line is interposed therebetween.

6. A semiconductor storage device having a divided word line structure including a plurality of sub-word lines each having an open end and a main word line provided so as to be shared among the plurality of sub-word lines, the semiconductor storage device comprising:

sub-decode lines and reverse sub-decode lines provided so as to correspond to the respective sub-word lines corresponding to the same main word line;

a common ground line provided so as to be shared among the plurality of sub-word lines;

a first decoder which selectively supplies a high or low potential to the sub-decode line according to whether or not the address of a corresponding sub-word line is designated, and supplies to the reverse sub-decode line a potential which is the reverse of the potential supplied to the sub-decode line; and a second sub-decoder which receives the potentials supplied to the sub-decode line or the reverse sub-decode line and selectively causes a corresponding sub-word line to receive a high voltage signal or to be connected to the common ground line, wherein two lines of the plurality of sub-decode lines and reverse sub-decode lines corresponding to the plurality of sub-word lines, which are not simultaneously supplied with a high potential are provided so as to become adjacent to each other; and the common ground line passes through substantially the center between the two adjacently-positioned lines.

7. The semiconductor storage device as defined in claim 6, wherein the two lines provided on the respective sides of the common ground line comprising a paired sub-decode line and reverse sub-decode line comprise a parallel section in which the pair of lines extend parallel to each other and a crossing section at which the paired lines are switched in position while the common ground line is interposed therebetween.

* * * * *